(12) United States Patent
Ozeki

(10) Patent No.: US 10,644,208 B2
(45) Date of Patent: May 5, 2020

(54) METHOD OF MANUFACTURING LIGHT EMITTING DEVICE

(71) Applicant: NICHIA CORPORATION, Anan-shi, Tokushima (JP)

(72) Inventor: Kenji Ozeki, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/554,272

(22) Filed: Aug. 28, 2019

(65) Prior Publication Data

US 2019/0386184 A1 Dec. 19, 2019

Related U.S. Application Data

(63) Continuation of application No. 16/053,183, filed on Aug. 2, 2018, now Pat. No. 10,546,982.

(30) Foreign Application Priority Data

Aug. 22, 2017 (JP) .................................. 2017-159127

(51) Int. Cl.
*H01L 33/50* (2010.01)
*H01L 33/60* (2010.01)
(Continued)

(52) U.S. Cl.
CPC .......... *H01L 33/505* (2013.01); *G02B 6/0073* (2013.01); *H01L 33/46* (2013.01);
(Continued)

(58) Field of Classification Search
CPC ..... H01L 33/50; H01L 33/505; H01L 33/507; H01L 33/0079; H01L 33/42
See application file for complete search history.

(56) References Cited

U.S. PATENT DOCUMENTS

2011/0175117 A1* 7/2011 Jagt .......................... H01L 33/44
257/88
2011/0210369 A1 9/2011 Daicho et al.
(Continued)

FOREIGN PATENT DOCUMENTS

JP 2010-219324 A 9/2010
JP 2010-283281 A 12/2010
(Continued)

OTHER PUBLICATIONS

Extended European Search Report of the corresponding European Patent Application No. 18187686.3, dated Oct. 18, 2018.
(Continued)

*Primary Examiner* — Jae Lee
(74) *Attorney, Agent, or Firm* — Global IP Counselors, LLP

(57) ABSTRACT

A method of manufacturing a light emitting device includes: bonding a wavelength conversion member on an upper face of a light emitting element while disposing a first light guide member to extend from a lateral face of the light emitting element to a lower face of the wavelength conversion member, the lower face of the wavelength conversion member having a larger area than the upper face of the light emitting element; and bonding a light transmissive member on an upper face of the wavelength conversion member while disposing a second light guide member to extend from the upper face of the wavelength conversion member to a lateral face of the light transmissive member, a lower face of the light transmissive member having a smaller area than the upper face of the wavelength conversion member.

16 Claims, 3 Drawing Sheets

(51) Int. Cl.
- *H01L 33/54* (2010.01)
- *H01L 33/58* (2010.01)
- *H01L 33/46* (2010.01)
- *F21V 8/00* (2006.01)

(52) U.S. Cl.
CPC .............. *H01L 33/54* (2013.01); *H01L 33/58* (2013.01); *H01L 33/60* (2013.01)

(56) References Cited

U.S. PATENT DOCUMENTS

| | | |
|---|---|---|
| 2012/0211774 A1 | 8/2012 | Harada |
| 2013/0221389 A1 | 8/2013 | Yamamuro |
| 2014/0203306 A1 | 7/2014 | Ito |
| 2016/0093777 A1 | 3/2016 | Sato et al. |
| 2016/0118548 A1* | 4/2016 | Kawaguchi ............ H01L 33/50 257/88 |
| 2016/0247987 A1 | 8/2016 | Ito |
| 2016/0348876 A1 | 12/2016 | Azuma et al. |
| 2017/0033267 A1 | 2/2017 | Tamaki et al. |
| 2017/0054064 A1 | 2/2017 | Shichijo et al. |
| 2017/0186920 A1 | 6/2017 | Kumano et al. |
| 2017/0222106 A1 | 8/2017 | Nakabayashi |
| 2017/0248281 A1 | 8/2017 | Ozeki |
| 2017/0309793 A1* | 10/2017 | Seo ........................ H01L 33/38 |
| 2018/0040775 A1 | 2/2018 | Wakamatsu et al. |

FOREIGN PATENT DOCUMENTS

| | | |
|---|---|---|
| JP | 2012-169442 A | 9/2012 |
| JP | 2013-110199 A | 6/2013 |
| JP | 2014-143300 A | 8/2014 |
| JP | 2017-041477 A | 8/2015 |
| JP | 2016-115729 A | 6/2016 |
| JP | 2017-117912 A | 6/2017 |
| JP | 2017-157610 A | 9/2017 |
| JP | 2017-183427 A | 10/2017 |
| WO | 2010044240 A1 | 4/2010 |
| WO | 2016094422 A1 | 6/2016 |

OTHER PUBLICATIONS

Notice of Allowance in the parent U.S. Appl. No. 16/053,183 dated May 29, 2019.

* cited by examiner

Light Emitting Device 10

Light Emitting Device R

Light Emitting Device X

Light Emitting Device Y

Light Emitting Device Z

METHOD OF MANUFACTURING LIGHT EMITTING DEVICE

CROSS-REFERENCE TO RELATED APPLICATION

This application is a continuation application of U.S. patent application Ser. No. 16/053,183 filed on Aug. 2, 2018. This application claims priority to Japanese Patent Application No. 2017-159127, filed on Aug. 22, 2017. The entire disclosures of U.S. patent application Ser. No. 16/053,183 and Japanese Patent Application No. 2017-159127 are hereby incorporated by reference in their entireties.

BACKGROUND

The present disclosure relates to a method of manufacturing a light emitting device.

In the past, a light emitting device has been proposed having a small emission area by disposing a light guide member, which has a smaller light emission face than the area of the light emission face of a light emitting element, on the upper face of the light emitting element. See, for example, Japanese Unexamined Patent Application Publication No. 2013-110199 and International Publication WO Publication No. 2010/044240.

SUMMARY

In the light emitting devices disclosed in the patent publications described above, however, the emission area decreases while the light emitted from the light emitting element passes through the wavelength conversion member. This allows for repeated scattering of the light in the wavelength conversion member before reaching the emission face of the light emitting device, which likely results in reduced light extraction efficiency.

The present disclosure is made in view of the problems discussed above and aims to provide a manufacturing method for a light emitting device having improved light extraction efficiency.

According to one aspect of the present disclosure, a method of manufacturing a light emitting device includes: bonding a wavelength conversion member on an upper face of a light emitting element while disposing a first light guide member to extend from a lateral face of the light emitting element to a lower face of the wavelength conversion member, the lower face of the wavelength conversion member having a larger area than the upper face of the light emitting element; and bonding a light transmissive member on an upper face of the wavelength conversion member while disposing a second light guide member to extend from the upper face of the wavelength conversion member to a lateral face of the light transmissive member, a lower face of the light transmissive member having a smaller area than the upper face of the wavelength conversion member.

The light emitting device manufactured according to an embodiment of the present disclosure can realize improvement of its light extraction efficiency.

DETAILED DESCRIPTION

Figure 1A:
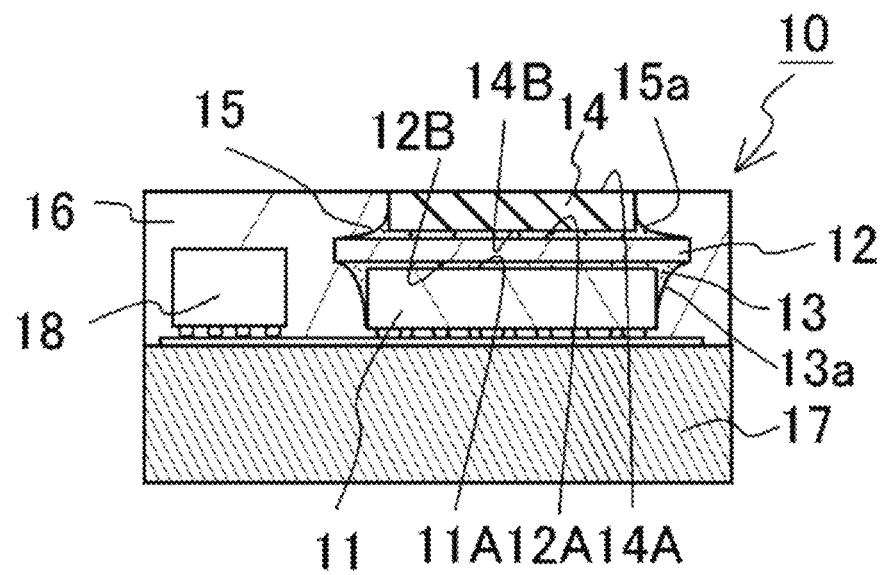
FIG. 1A is a sectional view schematically illustrating the construction of the light emitting device according to one embodiment of the present disclosure.

Examples of the light emitting devices according to certain embodiments of the present disclosure will be explained below with reference to the drawings. The drawings being referred to in the explanations below are schematic illustrations of the present disclosure. As such, the relative sizes of, and spacing and positional relationships between, the constituent members might be exaggerated, or some members might be omitted. In the explanations below, moreover, the same designations and reference numerals, as a rule, denote the same members or those of similar type, for which detailed explanations will be omitted when appropriate.

Light Emitting Device

Figure 1B:
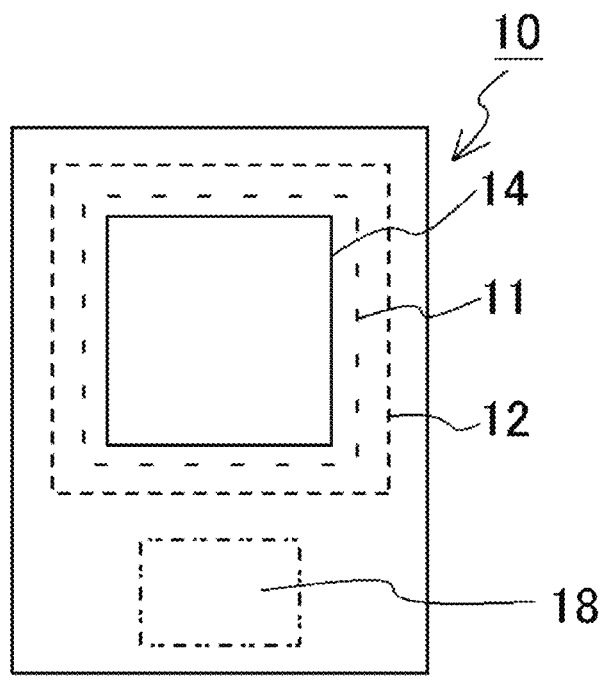
FIG. 1B is a plan view schematically illustrating the construction of the light emitting device according to the embodiment of the present disclosure.
Figure 1C:
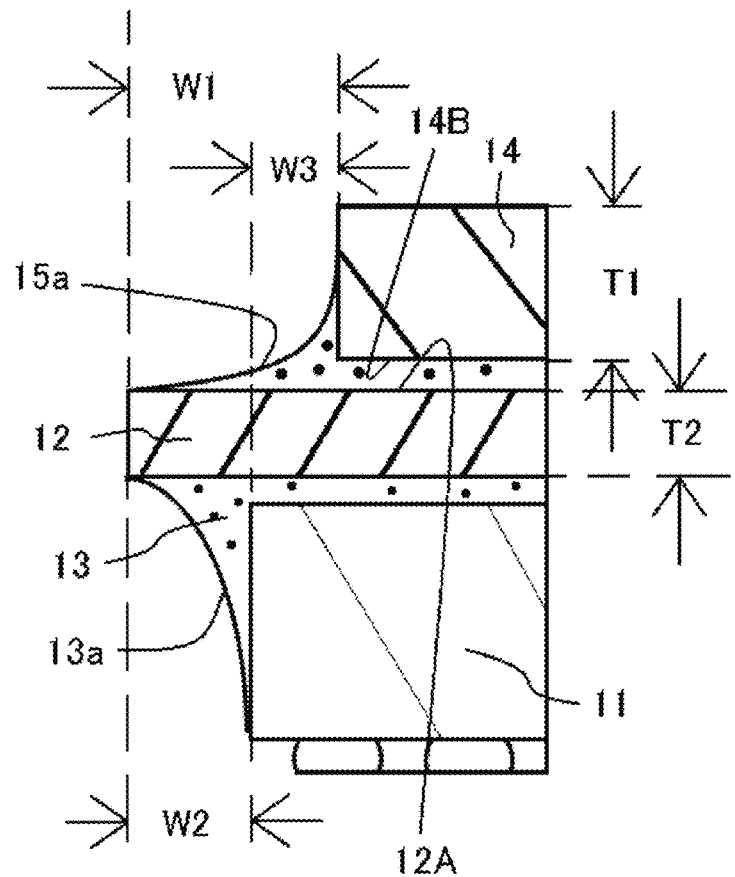
FIG. 1C is an enlarged view of the pertinent portion of FIG. 1B.

The light emitting device 10 according to one embodiment, as shown in FIG. 1, includes: a light emitting element 11; a wavelength conversion member 12 disposed on an upper face 11A of the light emitting element 11 and having a lower face 12B that has a larger area than the upper face 11A of the light emitting element 11; a first light guide member 13 extending from lateral faces of the light emitting element 11 to the lower face of the wavelength conversion member 12; a light transmissive member 14 disposed on an upper face 12A of the wavelength conversion member 12 and having a lower face 14B that has a smaller area than the upper face 12A of the wavelength conversion member 12; and a second light guide member 15 extending from the upper face 12A of the wavelength conversion member 12 to lateral faces of the light transmissive member 14. The upper face 14A of the light transmissive member 14 is exposed from other constituent members of the light emitting device 10, and serves as the principal light extraction face of the light emitting device 10. Such a light emitting device 10 can be utilized as a light source, for example, for lighting fixtures, automotive lighting systems, and the like.

In this light emitting device 10, the first light guide member 13 is disposed to extend from the outer edges of the light emitting element 11 to the outer edge of the lower face of the wavelength conversion member which extends out from the light emitting element 11 in a plan view. This allows the light emitted from the light emitting element 11 to enter the lower face 12B of the wavelength conversion member 12 while the area of the light emitting face becomes larger. Furthermore, the second light guide member 15 is disposed to extend from the outer edges of the light transmissive member 14 to the outer edge of the upper face of the wavelength conversion member 12 which extends out from the light transmissive member 14 in a plan view. This allows the output light from the upper face of the wavelength conversion member 12 to be externally released while the area of the light emission face becomes smaller.

In such a light emitting device, wavelength of the light emitted from the light emitting element can be efficiently converted, allowing the area of the light extraction face for the light after wavelength conversion to be set smaller, thereby enabling efficient extraction of high luminance light.

Light Emitting Element 11

For the light emitting element 11, it is preferable to employ a light emitting diode having semiconductor layers, including an n-type semiconductor layer, a p-type semiconductor layer, and a light emission layer. One having an appropriate wavelength can be selected depending on the purpose and applications. The light emitting element 11 has an upper face 11A on one side of the semiconductor stack. Examples of the light emitting elements 11 which emit blue light having a wavelength of from 430 nm to 490 nm, or green light having a wavelength of from 490 nm to 570 nm include those employing semiconductor layers, such as ZnSe, nitride-based semiconductors ($In_XAl_YGa_{1-X-Y}N$, $0 \leq X$, $0 \leq Y$, $X+Y \leq 1$), GaP and the like. For the light emitting elements 11 which emit light having a wavelength of from 620 nm to 750 nm, those employing GaAIAs, AlInGaP, and the like can be used. Among these examples, a nitride semiconductor ($In_XAl_YGa_{1-X-Y}N$, $0 \leq X$, $0 \leq Y$, $X+Y \leq 1$) is preferably used because it can emit short wavelength light and efficiently activate wavelength conversion substances such as phosphors contained in the wavelength conversion member. The composition, emission color, size, and the like of the light emitting element 11 can be suitably selected in accordance with the purpose and applications.

The light emitting element 11 includes a pair of electrodes connected to the semiconductor layers. The pair of electrodes may respectively be arranged on one face and the other faces of the semiconductor stack, but is preferably both disposed on the same side of the semiconductor stack. This allows the light emitting element 11 to be flip-chip mounted on a substrate 17. When flip-chip mounting the light emitting element on the substrate 17 using the face having the pair of electrodes as the lower face, the upper face 11A opposite the lower face will serve as the principal light extraction face of the light emitting element.

The light emitting element 11 can have various planar shapes, including a circular, ellipsoidal, or a polygonal shape such as a square, hexagon, but preferably has a square, rectangular, or hexagonal shape. The size can be suitably set depending on the applications and the performance to be achieved.

On the upper face 11A of the light emitting element 11, as described later, a wavelength conversion member 12 is disposed. The wavelength conversion member 12 can be secured on the upper face 11A of the light emitting element 11 by using, for example, a light transmissive adhesive. The wavelength conversion member 12 and the light emitting element 11 may be directly bonded without interposing an adhesive or the like.

Figure 2:
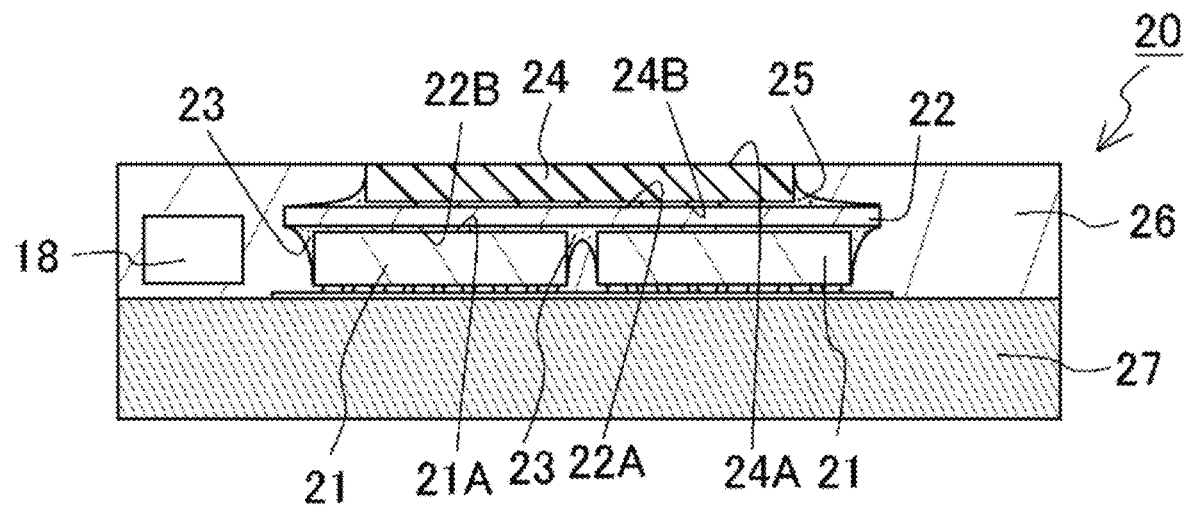
FIG. 2 is a sectional view schematically illustrating the construction of the light emitting device according to another embodiment of the present disclosure.

A single light emitting device may include a single light emitting element, or as shown in FIG. 2, two or more elements.

Wavelength Conversion Member 12

The wavelength conversion member 12 is disposed on the upper face 11A of the light emitting element 11. The wavelength conversion member 12 can be disposed and secured onto the upper face of the light emitting element 11 by employing various bonding methods. As described earlier, the wavelength conversion member 12 may be secured to the upper face 11A of the light emitting element 11 by interposing an adhesive or the like, or without interposing an adhesive. When directly bonded without an adhesive, the light emitted from the light emitting element can enter the wavelength conversion member 12 without any interference by an adhesive or the like to thereby improve the light extraction efficiency.

Examples of adhesives include materials similar to the light transmissive resins used to construct the first and second light guide members discussed later.

The lower face 12B of the wavelength conversion member 12 has a larger area than the upper face 11A of the light emitting element 11. The lower face 12B of the wavelength conversion member 12, for example, can have an area which is at least 10% larger than the upper face 11A of the light emitting element 11.

The planar shape of the wavelength conversion member 12 can be a circular, ellipsoidal, or a polygonal shape such as a square, hexagon, or the like. The shape is preferably a square, rectangle, or regular hexagon among such examples, more preferably the same planar shape as that of the light emitting element 11.

The wavelength conversion member 12 is preferably disposed so that the upper face 11A of the light emitting element 11 is contained within the lower face 12B. For example, in a plan view, some or all of the outer edges of the lower face 12B of the wavelength conversion member 12 are positioned on the outside of the outer edges of the upper face 11A of the light emitting element 11. In other words, the light emitting element 11 is preferably disposed so that its outer edges are on the inside of the outer edges of the lower face 12B of the wavelength conversion member 12 in a plan view. This allows the light emitted from the light emitting element 11 to efficiently enter the wavelength conversion member 12. Furthermore, the lower face 12B is preferably disposed so that the center thereof substantially coincides with the center of the upper face 11A of the light emitting element 11.

The wavelength conversion member 12 has a lower face 12B, an upper face 12A opposing the lower face 12B, and lateral faces contiguous to the lower face 12B and the upper face 12A. The upper face 12A and the lower face 12B are substantially equal in size, and are substantially in parallel with one another. Moreover, the lateral faces between the upper face 12A and the lower face 12B are preferably substantially perpendicular to the upper face 12A and the lower face 12B. This can more effectively mitigate the first light guide member 13 and/or the second light guide member 15 described later from wetting and spreading onto the lateral faces.

The wavelength conversion member 12 includes a phosphor that can convert at least some of the wavelengths of the light emitted from the light emitting element 11 into light having a different wavelength. For the wavelength conversion member 12, for example, a sintered body of a phosphor or a sheet of a resin, glass, or ceramic material containing a phosphor is preferably used. Examples of phosphors include cerium-activated yttrium aluminum garnet-based phosphors (YAG:Ce); cerium-activated lutetium aluminum garnet-based phosphors (LAG:Ce); europium- and/or chromium-activated nitrogen-containing calcium aluminosilicate-based phosphors ($CaO-Al_2O_3-SiO_2$:Eu); europium-activated silicate-based phosphors (for example, $(Sr,Ba)_2SiO_4$:Eu); nitride-based phosphors, such as ß-SiAlON phosphors (for example, $Si_{6-z}Al_zO_zN_{8-z}$:Eu ($0<Z<4.2$)), CASN-based phosphors and SCASN-based phosphors; KSF-based phosphors ($K_2SiF_6$:Mn), sulfide-based phosphors, and quantum dot phosphors. By combining and/or employing these phosphors using an appropriate blending ratio for a given color, the color rendering properties and/or color reproducibility can be adjusted.

YAG-based phosphors represent those that allow for emission of white-based mixed color light when suitably combined with a blue light emitting element.

In the case of producing a white light emitting device, the types and concentrations of the phosphors contained in the wavelength conversion member 12 can be suitably set so that it can emit white light. In the case of producing a white light emitting device, the concentration of the phosphors contained in the wavelength conversion member 12, for example, can be 5 to 50%.

A red light emitting device can be produced by using a blue light emitting element as the light emitting element 11 and a nitride-based semiconductor having a large red component as the phosphor. Moreover, amber light can be output by employing a blue light emitting element as the light emitting element 11 and a YAG-based phosphor and a nitride-based phosphor having large red components as the phosphors. The amber color refers to the chromaticity range corresponding to the region composed of the longer wavelength region of yellow and the shorter wavelength region of yellow-red as specified in JIS Z8110, or the region between the yellow region and the shorter wavelength region of yellow-red of the safety colors as specified in JIS Z9101. This is a region having the dominant wavelength falling in the range of, for example, from 580 nm to 600 nm. In the case of producing a red or amber light emitting device, the concentration of the phosphors contained in the wavelength conversion member is, for example, about from 60 to 80 mass percent.

The wavelength conversion member 12 may be formed with a single layer of one type of material, a single layer of two or more types of materials combined, or by stacking two or more single layers.

The wavelength conversion member 12, moreover, may also contain a light diffusing material as needed. Examples of light diffusing materials include titanium oxide, barium titanate, aluminum oxide, silicon oxide, and the like.

From the standpoint of heat dissipation and light extraction efficiency, the smaller the thickness T of the wavelength conversion member 12 is, the more preferable it is. Furthermore, the wavelength conversion member 12 preferably has the thickness T that can impart a sufficient mechanical strength to the wavelength member 12 without allowing the mechanical strength to degrade during the manufacturing process. Taking these into consideration, the thickness, for example, can be 20 µm to 300 µm, preferably 50 µm to 200 µm, more preferably 50 µm to 150 µm. As long as it contains wavelength conversion substances required to achieve a given emission color, the thinner the wavelength conversion member 12, the better it is from the standpoint of heat dissipation and light extraction efficacy, but is formed to a thickness in the above ranges on account of machining accuracy during the production of the wavelength conversion member.

The thickness T of the wavelength conversion member 12 is preferably smaller than the thickness of the light transmissive member described later. This can reduce the light leakage from the part of the upper face of the wavelength conversion member 12 not covered by the light transmissive member to travel via the cover member described later towards the light emission face, thereby producing a light emitting device having a clear distinction between the emission part and non-emission part.

A single light emitting device may include one wavelength conversion member, or multiple wavelength conversion members. When a light emitting device includes multiple light emitting elements, as shown in FIG. 2, a single wavelength conversion member may be provided for the multiple light emitting elements, or each light emitting element may be individually provided with a wavelength conversion member.

When a single wavelength conversion member is provided for multiple light emitting elements, the area and the positions of the outer edges described earlier, as well as the distances W2, W3, and W1 described later, can be set to those that correspond to the area enclosing the outer edges of the multiple light emitting elements, the positions of the edges enclosing all outer edges of the light emitting elements, and the distances corresponding thereto.

First Light Guide Member 13

The first light guide member 13 is disposed to extend from the lateral faces of the light emitting element 11 to the lower face 12B of the wavelength conversion member 12. The first light guide member 13 covers at least parts of the lateral faces of the light emitting element 11. The first light guide member 13 may cover the lateral faces of the light emitting element 11 entirely in the height direction. That is, the lowermost edges of the first light guide member 13 may coincide with the lowermost edges of the lateral faces of the light emitting element 11. This allows the emitted light from the lateral faces of the light emitting element 11 to be reflected at the interfaces between the first light guide member 13 and the cover member 16 described later to enter the wavelength conversion member 12.

Furthermore, the first light guide member 13 preferably covers the entire lower face 12B of the wavelength conversion member 12. That is, the outer edges of the first light guide member 13 in a plan view preferably coincide with the outer edges of the lower face 12B of the wavelength conversion member 12. The first light guide member 13 may cover the lateral faces of the wavelength conversion member 12, but preferably not cover.

The thickness of the first light guide member 13 covering the lateral faces of the light emitting element 11 increases as it approaches the top (i.e., becomes closer to the wavelength conversion member), and decreases as it approaches the bottom (i.e., becomes more distant from the wavelength conversion member). The lateral faces 13a of the first light guide member 13 which oppose the faces in contact with the lateral faces of the light emitting element 11 may be planar faces surrounding the periphery of the light emitting element 11, or may be curved faces inwardly concave or convex. The maximum thickness of the first light guide member 13 covering the lateral faces of the light emitting element 11 preferably matches the distance W2 which is from an outer edge of the lower face 12B of the wavelength conversion member 12 to an outer edge of the upper face 11A of the light emitting element 11.

The first light guide member 13 is preferably formed with a light transmissive material which can guide the light emitted from the light emitting element 11 to the wavelength conversion member 12. Specifically, the first light guide member 13 is preferably formed with a resin material because it can be easily handled and processed. Examples of the resin materials include resins containing one or more of silicone resins, modified silicone resins, epoxy resins, modified epoxy resins, acrylic resins, phenol resins, and fluorine resins, or their hybrid resins. Among such examples, silicone resins is preferable due to its high heat resistant, electrically insulation, and flexibility. The first light guide member 13 may contain a light diffusing material similar to those discussed earlier. The first light guide member 13 may be used as the adhesive for bonding the light emitting element 11 and the wavelength conversion member 12. In this case, the first light guide member 13 is also disposed between the upper face of the light emitting element 11 and the lower face of the wavelength conversion member 12.

Light Transmissive Member 14

The light transmissive member 14 is disposed on the upper face 12A of the wavelength conversion member 12, and has a lower face 14B that has a smaller area than the upper face 12A of the wavelength conversion member 12. The area of the lower face 14B of the light transmissive member 14, for example, is 90% at most of the upper face 12A of the wavelength conversion member 12.

Moreover, the upper face 14A of the light transmissive member 14 preferably has an area that is equal to, or smaller than, the upper face 11A of the light emitting element 11. The area of the upper face 14A of the light transmissive member 14, for example, is equal to, or smaller than, the upper face 11A of the light emitting element 11, preferably 90% or smaller, more preferably 85% or smaller. Furthermore, it is preferably an area of at least 50% of the upper face of the light emitting element, more preferably at least 40% or 30%. Setting the upper face 14A of the light transmissive member 14 to an area smaller than the upper face 11A of the light emitting element 11 in this manner can reduce the emission area of the light emitting device 10, thereby producing a higher luminance light emitting device.

The planar shape of the light transmissive member 14 can be a circular, ellipsoidal, or polygonal shape such as a square, rectangle, hexagon, or the like. Among such shapes, forming it to substantially the same shape as that of the upper face 12A of the wavelength conversion member 12 is preferable from the standpoint of reduction in light emission non-uniformity. When the light emitting device is used in combination with an optical lens, moreover, the upper face shape of the light transmissive member 14 is preferably a circular or a polygonal shape that is close to a circle.

The lower face 14B of the light transmissive member 14 is preferably positioned inside the upper face 11A of the light emitting element 11 and the upper face 12A of the wavelength conversion member 12. For example, in a plan view, some or all of the outer edges of the lower face 14B are preferably disposed on the inside of the outer edges of the upper face 11A of the light emitting element 11, more preferably all of the outer edges are disposed on the inside thereof. Furthermore, some or all of the outer edges of the lower face 14B are preferably disposed on the inside of the outer edges of the upper face 12A of the wavelength conversion member 12, more preferably all of the outer edges are disposed on the inner side thereof.

The light transmissive member 14 is preferably disposed so that the outer edges substantially coincide with the outer edges of the upper face 11A of the light emitting element 11 or on the inside thereof in a plan view. The lower face 14B of the light transmissive member 14 is preferably disposed so that the center thereof substantially coincides with the centers of the upper face 11A of the light emitting element 11 and the upper face 12A of the wavelength conversion member 12. Similar to the light emitting element 11 the lower face 14B of the light transmissive member 14 can have various planar shapes, but preferably has a square, rectangular, or regular hexagonal shape, more preferably substantially the same shape as that of the upper face 11A of the light emitting element 11.

In a sectional view, the distance W3 from an outer edge of the lower face 14B of the light transmissive member 14 to an outer edge of the upper face 11A of the light emitting element 11 can be, for example, from 0 μm to 100 μm, preferably from 10 μm to 60 μm, more preferably from 40 μm to 60 μm. This allows, when viewed from the light emission face side, the lower face 14B of the light transmissive member 14 to be entirely positioned inside the light emitting element 11, thereby producing a high light extraction efficiency light emitting device. Furthermore, the distance W1 from an outer edge of the lower face 14B of the light transmissive member 14 to an outer edge of the upper face 12A of the wavelength conversion member 12 is preferably about 50 μm to 200 μm.

The light transmissive member 14 can be formed with, for example, a molded resin body such as an epoxy, silicone, phenol, or polyimide resin, glass such as borosilicate, quartz, or sapphire, or a light transmissive material such as an inorganic material. Among such examples, a glass material is preferable for the light transmissive member 14. The light transmissive member 14 constructs an outer surface of the light emitting device 10, therefore, the employment of a glass material for the light transmissive member 14 can make the light emission face less likely to degrade even in the case of a high luminance light emitting device with a reduced light emission face. Moreover, the surface of a glass material is not tacky as compared to a resin material. Accordingly, dust is less likely to adhere to the light emission face, and the light emission face is less likely to stick to a carrier tape or the like during transportation or storage of the light emitting device. The transmissivity here refers to the property of allowing at least 60%, preferably at least 80%, of the light emitted from the light emitting element to pass through.

Moreover, the light transmissive member 14 preferably has a less thermal conductivity than the thermal conductivity of the materials that construct the light emitting element. Specifically, the thermal conductivity of GaN is 1.3 W/cmk to 2.0 W/cmk, the thermal conductivity of GaP is 1.1 W/cmk, and the thermal conductivity of InP is 0.68 W/cmk, therefore, depending on the type of the light emitting element, the thermal conductivity of the light transmissive member is more preferably less than these values. This facilitates with priority the dissipation of the heat generated by the wavelength conversion member via the light emitting element to the substrate side.

The light transmissive member 14 may be formed with a single layer of one type of material, a single layer of two or more materials combined, or multiple layers by stacking such single layers.

The light transmissive member 14 may contain any of the light diffusing materials described earlier as needed.

A single light emitting device may have one light transmissive member or multiple light transmissive members. When a light emitting device includes multiple light emitting elements and/or wavelength conversion members, as shown in FIG. 2, a single light transmissive member may be provided for the multiple light emitting elements and/or wavelength conversion members, or each light emitting element and/or wavelength conversion member may be individually provided with a light transmissive member.

When a single light transmissive member is provided for multiple light emitting elements and/or wavelength conversion members, the area and the positions of the outer edges described earlier and the distances, for example W3 and W1, can be set to those that correspond to the area enclosing the outer edges of the multiple light emitting elements and/or wave conversion members, the positions of the edges enclosing all outer edges of the light emitting elements and/or wavelength conversion members, and the distances corresponding thereto.

Second Light Guide Member 15

The second light guide member 15 is disposed to extend from the upper face 12A of the wavelength conversion member 12 to the lateral faces of the light transmissive member 14. The second light guide member 15 covers at least parts of the lateral faces of the light transmissive member 14, and may cover them entirely. That is, the uppermost edges of the second light guide member 15 may coincide with the uppermost edges of the lateral faces of the light transmissive member 14. This allows the light emitted from the wavelength conversion member 12 to be reflected at the interfaces between the second light guide member 15 and the cover member 16 described later to enter the wavelength conversion member 12 or the light transmissive member 14. As a result, the emitted light can be efficiently narrowed, and the luminance can be increased.

The second light guide member 15 covers at least part of the upper face 12A of the wavelength conversion member 12, but preferably covers it entirely. That is, the outermost edges of the second light guide member 15 preferably coincide with the outer edges of the upper face 12A of the wavelength conversion member 12. The second light guide member 15 may cover the lateral faces and/or the lower face of the wavelength conversion member 12, but preferably not cover them. The second light guide member 15, moreover, may cover the upper face of the light transmissive member, but preferably not cover it.

The thickness of the second light guide member 15 covering the lateral faces of the light transmissive member 14 increases as it approaches the bottom (i.e., becomes closer to the wavelength conversion member 12) and decreases as it approaches the top (i.e., becomes more distant from the wavelength conversion member 12). The lateral faces 15a of the second light guide member 15 opposing the faces in contact with the light transmissive member 14 may be planar faces that enclose the outer periphery of the light transmissive member 14 or curved faces outwardly concave or convex (i.e., to the cover member described later), but are preferably outwardly concave faces. In this way, the thickness of the cover member 16 described later which is disposed on the upper face 12A of the wavelength conversion member 12 can be increased. This can reduce the possibility of light leakage from the cover member surrounding the outer periphery of the upper face 14A of the light transmissive member 14 on the light emission face side of the light emitting device 10, thereby producing a higher luminance light emitting device.

The second light guide member 15 is preferably formed with a light transmissive material that can guide the light emitted from the wavelength conversion member 12 to the light transmissive member 14. For example, it can be formed using the same or a similar material to that used in forming the first light guide member 13.

The second light guide member 15 can be used as the adhesive to secure the wavelength conversion member 12 and the light transmissive member 14. In this case, the second light guide member 15 is also disposed between the upper face of the wavelength conversion member 12 and the lower face of the light transmissive member 14.

It is preferable to use the same material for the first light guide member 13 and the second light guide member 15. Using the same material can improve the operational efficiency during manufacturing. Moreover, it is preferable to adjust the viscosity of the second light guide member 15 to be lower than the viscosity of the first light guide member 13 when there is a large difference between the distance W1 from an outer edge of the lower face 14B of the light transmissive member 14 to an outer edge of the upper face 12A of the wavelength conversion member 12 and the distance W2 from an outer edge of the lower face 12B of the wavelength conversion member 12 to an outer edge of the upper face 11A of the light emitting element 11. This helps the second light guide member 15 to spread over the upper face of the wavelength conversion member 12 thereby covering the entire upper face of the wavelength conversion member 12. The viscosity of the resin material can be adjusted, for example, by the amount of filler contained in the resin material.

Cover Member 16

It is preferable for the light emitting device 10 in this embodiment to further include a cover member 16 that covers the lateral faces or the like of the first light guide member 13 and the second light guide member 15.

The cover member 16 covers the lateral faces of the light emitting element 11, the lateral faces of the wavelength conversion member 12, the lateral faces 13a of the first light guide member 13, the lateral faces of the light transmissive member 14, and the lateral faces 15a of the second light guide member 15. As shown in FIG. 1A, the cover member 16 preferably also covers the lateral faces of the light emitting element 11 exposed from the first light guide member 13, the lateral faces of the light transmissive member 14 exposed from the second light guide member 15, the upper face 12A of the wavelength conversion member 12, the lower face of the light emitting element 11, and all electrodes. This allows essentially all light emitted from the light emitting element 11 to enter the wavelength conversion member 12, and further enter the light transmissive member 14.

As described later, when the light emitting element 11 is mounted on the substrate 17, the cover member 16 is preferably further disposed between the lower face of the light emitting element 11 and the substrate 17, and on the substrate 17.

The cover member 16 is preferably formed with a material that can reflect the light emitted from the light emitting element 11. It can specifically be formed by using the same or a similar resin material to that used for the first light guide member 13 with a light reflecting substance contained therein. Examples of light reflecting substances include titanium oxide, silicon oxide, zirconium oxide, magnesium oxide, yttrium oxide, yttria-stabilized zirconia, calcium carbonate, calcium hydroxide, calcium silicate, zinc oxide, barium titanate, potassium titanate, alumina, aluminum nitride, boron nitride, mullite, and the like. Among such examples, titanium oxide is preferable because it is relatively stable against moisture and has a high refractive index.

The cover member 16 can be formed, for example, by injection molding, potting, printing, molding, compression molding, or the like.

Substrate 17

The light emitting element 11 may optionally be mounted on a substrate 17. The substrate 17 can integrally support the light emitting element 11 and the cover member 16. On the surface of the substrate 17, for example, a wiring pattern is formed for electrical connection between an external power supply and the light emitting element. The light emitting element is mounted on the wiring pattern, for example, via a bonding member. The light emitting element 11 may be flip-chip mounted or face-up mounted on the substrate depending on the configuration thereof, but is preferably flip-chip mounted.

Examples of bonding members include bumps made of Au or alloys thereof, eutectic solder (Au—Sn), Pb—Sn, lead-free solder, and the like.

It is preferable to use for the substrate 17 an insulating material barely transmitting the light from the light emitting element 11 and external light. Examples include ceramic materials, such as alumina, aluminum nitride, or the like, and resin materials such as phenol resins, epoxy resins, polyimide resins, BT resin, polyphthalamide, or the like. A composite component made of an insulating material and a metal member may alternatively be used. In the case of employing a resin material for the substrate 17, inorganic fillers such as glass fibers, silicon oxide, titanium oxide, alumina, or the like may be mixed into the resin as needed. This can enhance the mechanical strength, as well as reducing the thermal expansion coefficient and increasing the reflectance. The substrate 17 can be set to a given thickness in accordance with the purpose and applications.

On the substrate 17, a frame that surrounds the cover member 16 and/or the cover member 16 or the like may be disposed, in addition to the light emitting element 11.

Electronic Parts

The light emitting device 10 according to this embodiment may include another electronic part 18 placed adjacent to the light emitting element 11, in addition to the light emitting element 11. Examples of electronic parts 18, which are parts provided for purposes other than light emission of the light emitting device 10, include a transistor for controlling the light emitting element, a protection element, such as a Zener diode to which an electric current flows when a prescribed level of voltage or higher is applied, and the like. These electronic parts 18 are preferably embedded in the cover member 16.

In the light emitting device 10 constructed as above, the light emitted from the light emitting element passes through the wavelength conversion member 12 having a larger area before externally output from the upper face 14A of the light transmissive member 14, the light emission face of the light emitting device 10, while the emission area becomes smaller by means of the second light guide member 15 and the light transmissive member 14.

That is, by separating the wavelength conversion portion from the portion reducing an light emission area, the distance of travel is shortened for the light that passes through the wavelength conversion member 12 to thereby minimize the scattering effect of the wavelength conversion substances. This can increase the light extraction efficiency, producing a higher luminance light emitting device 10.

Method of Manufacturing Light Emitting Device

The light emitting device described above can be manufactured, for example, by the methods explained below.

Manufacturing Method A

A wavelength conversion member having a lower face that has a larger area than the upper face of the light emitting element is bonded on the upper face of a light emitting element via an uncured resin material used for forming a first light guide member, while disposing the first light guide member to extend from the lateral faces of the light emitting element to the lower face of the wavelength conversion member.

A light transmissive member having a lower face that has a smaller area than the upper face of the wavelength conversion member is bonded on the upper face of the wavelength conversion member which is bonded to the light emitting element, via an uncured resin material used for forming a second light guide member, while disposing the second light guide member to extend from the upper face of the wavelength conversion member to the lateral faces of the light transmissive member.

Manufacturing Method B

A wavelength conversion member having a lower face that has a larger area than the upper face of the light emitting element is directly bonded on the upper face of a light emitting element.

A first light guide member is disposed to extend from the lateral faces of the light emitting element to the lower face of the wavelength conversion member.

A light transmissive member having a lower face that has a smaller area than the upper face of the wavelength conversion member is bonded on the upper face of the wavelength conversion member which is bonded to the light emitting element via an uncured resin material used for forming a second light guide member, while disposing the second light guide member to extend from the upper face of the wavelength conversion member to the lateral faces of the light transmissive member.

Manufacturing Method

A wavelength conversion member having a lower face that has a larger area than the upper face of the light emitting element is prepared.

A light transmissive member having a lower face that has a smaller area than the upper face of the wavelength conversion member is directly bonded on the upper face of the wavelength conversion member.

A second light guide member is disposed to extend from the upper face of the wavelength conversion member to the lateral faces of the light transmissive member.

The wavelength conversion member whose upper face is bonded to the light transmissive member is bonded on the upper face of the light emitting element, via an uncured resin material used for forming a first light guide member, while disposing the first light guide member to extend from the lateral faces of the light emitting element to the lower face of the wavelength conversion member.

Manufacturing Method D

A wavelength conversion member having a lower face that has a larger area than the upper face of the light emitting element is directly bonded on the upper face of a light emitting element.

A light transmissive member having a lower face that has a smaller area than the upper face of the wavelength conversion member is directly bonded on the upper face of the wavelength conversion member.

A first light guide member is disposed to extend from the lateral faces of the light emitting element to the lower face of the wavelength conversion member.

A second light guide member is disposed to extend from the upper face of the wavelength conversion member to the lateral faces of the light transmissive member.

In any of the manufacturing methods described above, it is preferable to perform, at any given stage, disposing a light emitting element 11 on a substrate 17, and perform disposing a cover member at any given stage after disposing a first light guide member 13 and a second light guide member 15.

Each step in the manufacturing methods described above can be performed by the methods described below.

Bonding Light Emitting Element 11 or Light Transmissive Member 14 to Wavelength Conversion Member 12

Methods of bonding the light emitting element 11 and/or the light transmissive member 14 to the wavelength conversion member 12 include those that are known in the art.

For example, pressure bonding, sintering, or room temperature bonding may be used. Among these examples, room temperature bonding is preferable.

As room temperature bonding, for example, surface activated bonding, hydroxyl group bonding, or atomic diffusion bonding can be utilized. Surface activated bonding is a method in which surfaces to be bonded are processed in a vacuum to facilitate chemical bonding before being bonded together. Hydroxyl group bonding is a method in which hydroxyl groups are formed on the surfaces to be bonded by way of, for example, atomic layer deposition, followed by allowing the hydroxyl groups on the surfaces to be bonded with one another. Atomic diffusion bonding is a method in which a metal film having a monoatomic layer thickness is formed on each of the surfaces to be bonded, followed by being brought into contact with one another in a vacuum or inert gas atmosphere to achieve metal atom bonding. Using such a direct bonding method allows the light emitting element 1 and the wavelength conversion member 12 to be integrated under temperatures close to room temperature.

Disposing First Light Guide Member 13 and Second Light Guide Member 15

The first light guide member 13 and the second light guide member 15 can be formed, for example, by potting, printing, or the like. Among these examples, potting is preferably employed using the uncured resin materials described earlier. The first light guide member 13 and the second light guide member 15 are preferably formed to have a concave surface. Such a surface shape can easily be achieved by potting. By adjusting the amount and/or viscosity of the uncured resin material used, the surface can be suitably controlled to have a concave or convex shape. The resin materials may contain a filler for adjusting the viscosity. Using a resin material for the first light guide member 13 and the second light guide member 15 allows the first light guide member 13 or the second light guide member 15 to creep on and partially or entirely cover the lateral faces of the light emitting element or the light transmissive member.

Mounting on Substrate 17

The light emitting element 11 is preferably mounted on a substrate 17. Flip-chip mounting is a preferable method used to mount the light emitting element 11. The wavelength conversion member or the like can be disposed on the light emitting element 11 before or after mounting the light emitting element on the substrate.

Disposing Cover Member 16

A cover member 16 is disposed to cover the lateral faces of the wavelength conversion member 12, lateral faces of the first light guide member 13, and lateral faces of the second light guide member 15. Specifically, the cover member 16 is formed by disposing an uncured resin material 16A for forming the cover member 16 in the surrounds of the light emitting element 11, and optionally on the substrate 17.

The uncured resin member 16A employed for forming the cover member 16 can be applied by using, for example, a resin dispenser that can be moved up and down or from side to side relative to the substrate 17. The cover member 16 can alternatively be formed by using, for example, molds.

Embodiment 1

Light Emitting Device

As shown in FIG. 1A, a light emitting device 10 according to Embodiment 1 includes a light emitting element 11, a wavelength conversion member 12, a first light guide member 13, a light transmissive member 14, and a second light guide member 15. The light emitting element 11 is mounted on a substrate 17 having a wiring layer, and a cover member 16 is disposed surrounding the light emitting element 11, between the light emitting element 11 and the substrate 17, and on the substrate 17.

The light emitting element 11 is an LED chip having substantially a square shape of 0.8×0.8 mm in a plane view, and 0.15 mm in height, which includes a pair of positive and negative electrodes on the same face side.

The substrate 17 is formed using aluminum nitride, and has a wiring layer at least on the upper face. On the wiring layer, the light emitting element 11 is flip-chip mounted via gold bumps.

On the light emitting element 11, a YAG ceramic having substantially a square shape of 0.9×0.9 mm in a plan view, and 1.10 μm in height is disposed as the wavelength conversion member 12 so that the center thereof substantially coincides with the center of the light emitting element 11 in a plan view. The YAG ceramic here is made by sintering alumina containing a YAG-based phosphor, and bonded on the light emitting element 11 via the first light guide member.

The first light guide member 13 is disposed to extend from the lateral faces of the light emitting element 11 to the lower faces of the wavelength conversion member 12. That is, the first light guide member 13 is disposed to be in contact with at least a portion of the lower face of the wavelength conversion member. The first light guide member 13 has the upper end in contact with the lower face of the wavelength conversion member 12, and the lower end in contact with the lateral faces of the light emitting element 11. The edges of the first light guide member 13 on the outer side substantially coincide with the outer edges of the lower face of the wavelength conversion member 12. The thickness of the first light guide member 13 becomes smaller as it approaches the substrate 17 along the lateral faces of the light emitting element 11. The lateral faces of the first light guide member 13 opposing the lateral faces of the light emitting element 11 are outwardly concave faces. The first light guide member 13 is a silicone resin which contains a filler for adjusting the viscosity. The first light guide member 13 is concurrently used as a bonding member between the light emitting element 11 and the wavelength conversion member 12 being interposed between the light emitting element 11 and the wavelength conversion member 12.

On the upper face 12A of the wavelength conversion member 12, transparent glass having substantially a square shape of 0.76×0.76 mm in a plan view, and 100 μm in height is disposed so that the center thereof substantially coincides with the centers of the light emitting element 11 and the wavelength conversion member 12 in a plan view. The transparent glass here is borosilicate glass which is bonded on the light emitting element 11 via the second light guide member.

The second light guide member 15 is disposed to extend from the upper face of the wavelength conversion member 12 to the lateral faces of the light transmissive member 14. The second light guide member 15 has the lower end in contact with the upper face of the wavelength conversion member 12, and the upper end in contact with the lateral faces of the light transmissive member 14. Furthermore, on the upper face of the wavelength conversion member 12, the outer edges of the second light guide member 15 coincide with the outer edges of the wavelength conversion member 12. The thickness of the second light guide member 15 becomes smaller as it approaches the upper face 14A along the lateral faces of the light transmissive member 14. The lateral faces of the second light guide member 15 opposing the lateral faces of the light transmissive member 14 are outwardly concave faces. The second light guide member 15 is a silicone resin which contains silica as a filler for adjusting the viscosity. The second light guide member 15 is concurrently used as a bonding member between the wavelength conversion member 12 and the light transmissive member 14 being interposed between the wavelength conversion member 12 and the light transmissive member 14.

The light emitting element 11 is disposed so that its outer edges are positioned inner side of the outer edges of the wavelength conversion member in a plan view.

The upper face area of the light transmissive member 14 is smaller than the upper face areas of the light emitting element 11 and the wavelength conversion member 12, and the outer edges are located on inner side of the outer edges of the light emitting element and the wavelength conversion member in a plan view.

Figure 3A:
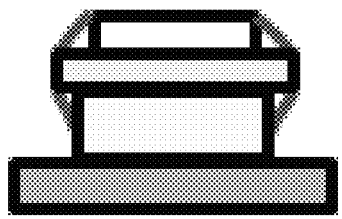
FIGS. 3A to 3E are simplified diagrams showing structures of the light emitting device according to the embodiment and the light emitting devices according to comparison examples.
Figure 3B:
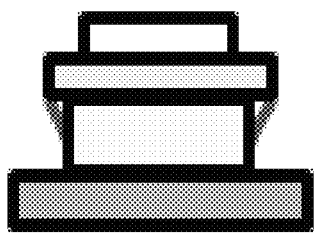
Figure 3C:
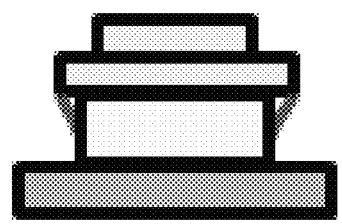
Figure 3D:
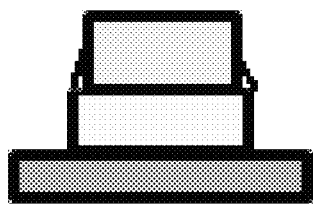
Figure 3E:
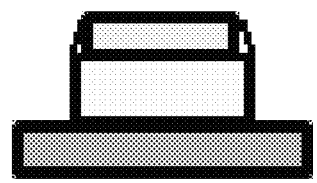

The thickness of the wavelength conversion member is smaller than the thickness of the light transmissive member.

conversion members of the light emitting devices 10 (FIG. 3A), R (FIG. 3B), X (FIG. 3C), Y (FIG. 3D), and Z (FIG. 3E), and the phosphor contents were adjusted so that these light emitting devices achieve comparable chromaticity.

To each of the light emitting device 10 explained earlier and the light emitting devices R, X, Y, and Z produced for comparison purposes, an electric current of 1000 mA was applied to measure the luminous flux. The results shown below confirmed that the light emitting device 10 achieved a higher luminous flux than any of the light emitting devices R, X, Y, and Z. The notation. "(minimal)", in the second light guide member 15 column for the light emitting devices R and X means that although an adhesive is interposed between the wavelength conversion member and the light transmissive member, most of the upper face of the wavelength conversion member that is positioned on the outside of the outer edges of the light transmissive member (specifically 90% or more) is exposed from the adhesive.

TABLE 1

| Light Emitting Device | Wavelength Conversion Member 12 | First Light Guide Member 13 | Light Transmissive Member 14 | Second Light Guide Member 15 | Luminous Flux (lm) | Relative Value of Luminous Flux (%) |
|---|---|---|---|---|---|---|
| 10 (FIG. 3A) | 0.9 × 0.9 mm 110 μm thick | Present | 0.76 × 0.76 mm 100 μm thick | Present | 126.6 | 112.3 |
| R (FIG. 3B) | 0.9 × 0.9 mm 110 μm thick | Present | 0.76 × 0.76 mm 100 μm thick | Absent (minimal) | 124.7 | 110.6 |
| X (FIG. 3C) | 0.9 × 0.9 mm 110 μm thick | Present | Wavelength conversion member: 0.76 × 0.76 mm 70 μm thick | Absent (minimal) | 115.3 | 102.3 |
| Y (FIG. 3D) | 0.76 × 0.76 mm 180 μm thick | Present | Absent | Absent | 112.7 | 100 |
| Z (FIG. 3E) | 0.76 × 0.76 mm 110 μm thick | Present | Absent | Absent | 125.2 | 110.9 |

Moreover, the thermal conductivity of the borosilicate glass employed as the light transmissive member is less than the thermal conductivity of sapphire which is a material used in constructing the light emitting element.

Such a light emitting device 10 can be produced, for example, by the manufacturing Method A described earlier.

For comparison purposes, light emitting devices R, X, Y, and Z each having a similar construction to the light emitting device 10 except as shown in FIGS. 3B-3E were produced. For the bonding members between the light emitting element and the wavelength conversion member, and between the wavelength conversion member and the light transmissive member, a first light guide member and a second light guide member, respectively, were used. For this reason, the first light guide member and the second light guide member are interposed between the light emitting element and the wavelength conversion member, and between the wavelength conversion member and the light transmissive member, respectively. For this reason, with respect to the light emitting devices R (FIG. 3B) and X (FIG. 3C), some wetting and spreading of the second light guide member onto the lateral faces of the light transmissive member is expected.

The same types of phosphors were used for the wavelength conversion substances contained in the wavelength As described above, in the light emitting device 10, the light emitted from the light emitting element 11 enters the wavelength conversion member 12 while the planar area is increased by means of the first light guide member 13, therefore, the luminous flux per unit area of the light entering the lower face 12B of the wavelength conversion member 12 is reduced. This can reduce the wavelength conversion substance content per unit area in the direction of the thickness of the wavelength conversion member 12 thereby enabling the reduction in the thickness of the wavelength conversion member 12 itself. That is, the distance of travel of the light passing through the wavelength conversion member 12 is short, therefore excessive scattering in the wavelength conversion member 12 can be attenuated. This can improve the light extraction efficiency. Furthermore, the light of a given emission color achieved by passing through the wavelength conversion member 12 is externally output from the upper face 14A of the light transmissive member 14 which has a smaller planar area by means of the second light guide member 15 and the light transmissive member 14. Here, wavelength conversion substances is substantially absent in the second light guide member 15 and the light transmissive member 14 involved in the gradual reduction in the emission area, thereby reducing light attributable to scattering or the like caused by wavelength conversion substances or the like before the light reaches the upper face 14A of the light transmissive member 14. This can produce a light emitting device having a higher light extraction efficiency.

Embodiment 2

Light Emitting Device

As shown in FIG. 2, the light emitting device 20 according to embodiment 2 includes two light emitting elements 21, a wavelength conversion member 22 covering both of the light emitting elements, a first light guide member 23 disposed on the lateral faces of each light emitting element 21, a light transmissive member 24 disposed on the wavelength conversion member 22, and a second light guide member 25 disposed on the lateral faces of the light transmissive member 24. The two light emitting elements 21 are arranged on the substrate 27 having a wiring layer so that they form a rectangle as a whole in a plan view. The light emitting device 20 according to Embodiment 2 essentially has a similar construction to that of the light emitting device 10 except for including multiple light emitting elements 21 and disposing the first light guide member 23 and the cover member 26 between the adjacent light emitting elements 21.

The light emitting device 20 having multiple light emitting elements as described above has the same or similar effects to those of the light emitting device 10.

By including multiple light emitting elements 21, in particular, an even higher luminance light emitting device can be produced. Furthermore, by virtue of the first light guide member 23 covering the lateral faces of the adjacent light emitting elements facing each other, non-uniformity of color and luminance between the adjacent light emitting elements can be attenuated. At this time, the first light guide member 23 preferably has lateral faces that are concave to the substrate. Such a shape makes the exterior face of the first light guide member 23 an appropriate reflective surface to reflect the light from the lateral faces of the light emitting elements to efficiently guide the reflected light to the wavelength conversion member 22.

In a plan view, the outermost edges of the first light guide member 23 surrounding the light emitting elements 21 are located inner side of the outer edges of the wavelength conversion member 22.

The upper face 24A and the lower face 24B of the light transmissive member 24 have smaller areas than the area of the upper face 22A of the wavelength conversion member 22, and the outer edges of the light transmissive member 24, in a plan view, are positioned inner side of the outer edges of the upper face 22A of the wavelength conversion member 22 that surround the upper faces 21A of the two light emitting elements 21.

The thickness of the wavelength conversion member 22 is larger than the thickness of the light transmissive member 24.

What is claimed is:

1. A method of manufacturing a light emitting device comprising:
   bonding a wavelength conversion member on an upper face of a light emitting element while disposing a first light guide member to extend from a lateral face of the light emitting element to a lower face of the wavelength conversion member, the lower face of the wavelength conversion member having a larger area than the upper face of the light emitting element; and
   bonding a light transmissive member on an upper face of the wavelength conversion member while disposing a second light guide member to extend from the upper face of the wavelength conversion member to a lateral face of the light transmissive member, a lower face of the light transmissive member having a smaller area than the upper face of the wavelength conversion member.

2. The method of manufacturing a light emitting device according to claim 1, wherein
   the bonding of the wavelength conversion member on the upper face of the light emitting element includes using an uncured resin material used for forming the first light guide member.

3. The method of manufacturing a light emitting device according to claim 1, wherein
   the bonding of the light transmissive member on the upper face of the wavelength conversion member includes using an uncured resin material used for forming the second light guide member.

4. The method of manufacturing a light emitting device according to claim 2, wherein
   the bonding of the light transmissive member on the upper face of the wavelength conversion member includes using an uncured resin material used for forming the second light guide member.

5. The method of manufacturing a light emitting device according to claim 1, wherein
   an upper face of the light transmissive member has a smaller area than the upper face of the light emitting element.

6. The method of manufacturing a light emitting device according to claim 1, wherein
   the bonding of the light transmissive member on the upper face of the wavelength conversion member includes bonding the light transmissive member on the upper face of the wavelength conversion member so that an outer edge of the light transmissive member is positioned on an inner side of an outer edge of the light emitting element in a plan view.

7. The method of manufacturing a light emitting device according to claim 1, wherein
   the bonding of the wavelength conversion member on the upper face of the light emitting element includes bonding the wavelength conversion member on the upper face of the light emitting element so that an outer edge of the light emitting element is positioned on an inner side of an outer edge of the wavelength conversion member in a plan view.

8. The method of manufacturing a light emitting device according to claim 1, further comprising
   covering lateral surfaces of the first light guide member, the wavelength conversion member and the second light guide member with a cover member.

9. The method of manufacturing a light emitting device according to claim 1, wherein
   the bonding of the wavelength conversion member on the upper face of the light emitting element includes bonding the wavelength conversion member on an upper face of one or more additional light emitting elements.

10. The method of manufacturing a light emitting device according to claim 1, further comprising
    mounting the light emitting element on a substrate in a flip-chip manner.

11. The method of manufacturing a light emitting device according to claim 1, wherein the bonding of the wavelength conversion member on the upper face of the light emitting element includes bonding the wavelength conversion member on the upper face of the light emitting element so that the upper face of the light emitting element is in contact with the lower face of the wavelength conversion member.

12. The method of manufacturing a light emitting device according to claim 1, wherein
the bonding of the wavelength conversion member on the upper face of the light emitting element includes bonding the wavelength conversion member on the upper face of the light emitting element so that the upper face of the light emitting element is bonded to the lower face of the wavelength conversion member via an adhesive.

13. The method of manufacturing a light emitting device according to claim 1, wherein
the bonding of the light transmissive member on the upper face of the wavelength conversion member includes bonding the light transmissive member on the upper face of the wavelength conversion member so that the upper face of the wavelength conversion member is in contact with the lower face of the light transmissive member.

14. The method of manufacturing a light emitting device according to claim 1, wherein
the bonding of the light transmissive member on the upper face of the wavelength conversion member includes bonding the light transmissive member on the upper face of the wavelength conversion member so that the upper face of the wavelength conversion member is bonded to the lower face of the light transmissive member via an adhesive.

15. The method of manufacturing a light emitting device according to claim 1, wherein
a thickness of the wavelength conversion member is smaller than a thickness of the light transmissive member.

16. The method of manufacturing a light emitting device according to claim 8, wherein
the cover member contains a light reflecting substance.

* * * * *